(12) United States Patent
Nakamura

(10) Patent No.: US 6,188,229 B1
(45) Date of Patent: Feb. 13, 2001

(54) CONDUCTIVE-PATTERN RECOGNITION APPARATUS

(75) Inventor: Satoshi Nakamura, Toyama (JP)

(73) Assignee: NEC Corporation, Toyko (JP)

( * ) Notice: Under 35 U.S.C. 154(b), the term of this patent shall be extended for 0 days.

(21) Appl. No.: 09/143,736

(22) Filed: Aug. 28, 1998

(30) Foreign Application Priority Data

Aug. 28, 1997 (JP) .................................................. 9-232858

(51) Int. Cl.$^7$ ........................ G01R 27/08; G01N 27/00
(52) U.S. Cl. ................................................................ 324/695
(58) Field of Search ................................ 324/695, 691, 324/693, 558

(56) References Cited

U.S. PATENT DOCUMENTS

| | | | |
|---|---|---|---|
| 4,351,263 | * | 9/1982 | Rarig et al. ........................... 324/558 |
| 4,862,065 | * | 8/1989 | Pazda et al. .......................... 324/693 |
| 4,862,092 | * | 8/1989 | Juncosa ................................. 324/450 |

FOREIGN PATENT DOCUMENTS 2-257380    10/1990 (JP) .

\* cited by examiner

*Primary Examiner*—Safet Metjahic
*Assistant Examiner*—James C Kerveros
(74) *Attorney, Agent, or Firm*—Sughrue, Mion, Zinn, Macpeak & Seas, PLLC

(57) ABSTRACT

A conductive-pattern recognition apparatus is provided, which makes it sure to recognize a conductive pattern accurately. This apparatus is comprised of (a) a main electrode roller formed by circular main electrodes and circular insulators arranged alternately along a straight line and coupled together, (b) a pressure-sensitive rubber layer fixed onto an outer surface of the main electrode roller and contacted with the main electrodes and the insulators, (c) a moving mechanism for moving a specimen with a conductive pattern in a direction perpendicular to a rotation axis of the main electrode roller so that the specimen applies a pressure to the pressure-sensitive rubber layer, (d) a conduction detector for detecting electric conduction among at least two ones of the main electrodes of the main electrode roller through the pressure-sensitive rubber layer, and (e) a rotation detector for detecting a rotation amount of the main electrode roller. When a part of the pressure-sensitive rubber layer is contacted with the conductive pattern of the specimen, the part of the pressure-sensitive rubber layer causes electric conduction among corresponding ones of the main electrodes of the main electrode roller, thereby recognizing the conductive pattern of the specimen by using the conduction detector and the rotation detector.

16 Claims, 15 Drawing Sheets

CONDUCTIVE-PATTERN RECOGNITION APPARATUS

BACKGROUND OF THE INVENTION

1. Field of the Invention

The present invention relates to a conductive-pattern recognition apparatus and more particularly, to conductive-pattern recognition apparatus for recognizing a conductive pattern formed on a substrate, which is applicable to automatic pattern inspection of Printed Wiring Boards (PWBs) or the like.

2. Description of the Prior Art

In recent years, automation in the fabrication processes of PWBs has been progressing more and more for the purpose of labor-saving andefficiency-raising. According to this tendency, various inspection procedures such as visual inspection and production-lot discrimination, which were performed manually, have been becoming automated.

For example, various conductive-pattern recognition apparatuses making it possible to perform automatically the pattern inspection procedures of PWBs have been developed and practically used.

An example of the conventional conductive-pattern recognition apparatuses is shown in FIG. 1, which recognizes optically the conductive patterns of PWBS.

As shown in FIG. 1, this conventional conductive-pattern recognition apparatus is comprised of a moving or translation mechanism 106 for moving or translating a PWB 109 to be inspected in a direction A, a strip-shaped light source 130 for illuminating the surface of the PWB 109 with light, a lens 131 for collecting the light reflected by the surface of the PWB 109, and an optical line sensor 132 for sensing the light reflected by the surface of the PWB 109 and collected by the lens 131. The surface of the PWB 109 is covered with an insulator 133 except for a conductive circuit pattern 110. The optical line sensor 132, which has Charge-Coupled Devices (CCDs) arranged along a straight line, is fixed in parallel to the light source 130 and the lens 131.

On recognition or operation of this apparatus, the PWB 109 with the conductive pattern 110 is translated by the translation mechanism 106 in the direction A perpendicular to the line sensor 132. The light emitted from the light source 130 is reflected by the surface of the PWB 109 and then, the reflected light is collected by the lens 131 to be inputted into the line sensor 132.

The intensity of the reflected light by the conductive pattern 110 is higher than that of the reflected light by the insulator 133. Therefore, the conductive pattern 110 is able to be recognized by detecting the intensity difference of the reflected light.

In addition to the optical recognition apparatus explained above, pressure-sensitive recognition apparatuses have been known. An example of these conventional pressure-sensitive recognition apparatuses is shown in FIG. 2, which is an embossed-character reader and is disclosed in the Japanese Non-Examined Patent Publication No. 2-257380 published in 1990.

The conventional embossed-character reader is comprised of an idler roller 206 for moving or translating an embossed card 234 (i.e., a specimen) on which embossed characters 235 are formed, a pressure-sensitive rubber roller 236 whose electric resistance varies according to an applied pressure, a rotary encoder 237 fixed to the axis of the pressure-sensitive rubber roller 236 for detecting the rotational amount or distance of the roller 236, and a resistance detection means (not shown) for detecting the electric resistance of the pressure-sensitive rubber roller 236.

The pressure-sensitive rubber roller 236 has a pressure-sensitive rubber sheet formed by a silicone rubber containing proper conductive particles uniformly dispersed therein. The pressure-sensitive rubber sheet has electrodes S11, S12, S13, and S14 at its four sides.

In the conventional embossed-character reader shown in FIG. 2, the specimen or embossed card 234 is translated in the direction A between the rollers 206 and 236 on reading operation. During the reading operation, the electric resistance of the pressure-sensitive rubber sheet of the roller 236 and the rotational distance of the roller 236 are detected, thereby obtaining a pattern of the area change due to the embossed characters 235. Then, the pattern of the area change thus obtained is compared with the specific reference patterns prepared in advance, thereby recognizing the embossed characters 235 on the card 234 using the pattern matching procedure.

For example, if the embossed characters 235 are a series of the characters "0123" as shown in FIG. 3, the area change of these characters 235 along the translation or moving direction A is converted to the change of an electric current as shown in FIG. 4. This pattern of the electric current is compared with the reference patterns to thereby recognize the characters 235 through the pattern matching procedure. Thus, the characters 235 are found "0123".

With the conventional optical conductive-pattern recognition apparatus shown in FIG. 1, however, there is the following problem Specifically, the conductive pattern 110 of the PWB 109 is typically made of copper (Cu) and the insulator 133 of the PWB 109 is made of an epoxy resin reinforced by a glass cloth. Therefore, the conductive pattern 110 has metallic luster allowing the illuminated light to be efficiently reflected. On the other hand, the insulator 133 having a rough surface causes irregular reflection and/or transmission of the illuminated light, resulting in reduction of reflection of the illuminated light.

Moreover, the conductive pattern 110 made of copper tends to be oxidized by salts or acids adhered on human hands and oxygen ($O_2$) contained in the atmospheric air, thereby forming a thin film of copper oxide on the pattern 110. The thin film of copper oxide thus produced is difficult to reflect the illuminated light. As a result, the obtainable intensity difference of the light between the conductive pattern 110 and the insulator 133 becomes small and consequently, recognition error tends to occur.

There arises a similar problem when the conductive pattern 110 is made of a dark-colored material such as carbon paste or a conductor/resin mixture such as conductive paste. If things come to the worst, recognition of the pattern 110 will become impossible.

With the conventional pressure-sensitive conductive-pattern recognition apparatus shown in FIG. 2, there is a problem that the embossed characters 235 is unable to be recognized unless the characters 235 are protruded from their neighboring area. This is because the reading or recognition operation is performed by detecting the change of the electric resistance of the pressure-sensitive rubber roller 236.

Also, there is another problem that recognition is possible for simple patterns only due to the following reason.

It is popular that the conductive patterns of PWBs are complex compared with the embossed characters 235.

Therefore, the change of the electric resistance obtained from the conductive patterns of PWBs is difficult to be pattern-matched with the reference patterns. Further, the reference patterns themselves are extremely difficult to be prepared in advance.

SUMMARY OF THE INVENTION

Accordingly, an object of the present invention is to provide a conductive-pattern recognition apparatus that recognizes a conductive pattern accurately independent of the material and the surface state of the conductive pattern.

Another object of the present invention is to provide a conductive-pattern recognition apparatus that prevents recognition errors even for complex conductive patterns.

Still another object of the present invention is to provide a conductive-pattern recognition apparatus that recognizes a conductive pattern depressed from or leveled with its neighborhood as well as a conductive pattern protruding from its neighborhood.

The above objects together with others not specifically mentioned will become clear to those skilled in the art from the following description.

A conductive-pattern recognition apparatus according to a first aspect of the present invention is comprised of (a) a main electrode roller formed by circular main electrodes and circular insulators arranged alternately along a straight line and coupled together, (b) a pressure-sensitive rubber layer fixed onto an outer surface of the main electrode roller and contacted with the main electrodes and the insulators of the main electrode roller, (c) a moving mechanism for moving a specimen with a conductive pattern in a direction perpendicular to a rotation axis of the main electrode roller so that the specimen applies a pressure to the pressure-sensitive rubber layer, (d) a conduction detector for detecting electric conduction among at least two ones of the main electrodes of the main electrode roller through the pressure-sensitive rubber layer, and (e) a rotation detector for detecting a rotation amount of the main electrode roller.

When a part of the pressure-sensitive rubber layer is contacted with the conductive pattern of the specimen, the part of the pressure-sensitive rubber layer causes electric conduction among corresponding ones of the main electrodes of the main electrode roller. Thus, the conductive pattern of the specimen is recognized by using the conduction detector and the rotation detector.

With the conductive-pattern recognition apparatus according to the present invention, the main electrode roller is formed by the circular main electrodes and the circular insulators arranged alternately along a straight line and coupled together The pressure-sensitive rubber layer is fixed onto the outer surface of the main electrode roller and is contacted with the main electrodes and the insulators of the main electrode roller.

Therefore, when a specimen with a conductive pattern is moved in a direction perpendicular to the rotation axis of the main electrode roller so that the specimen applies a pressure to the pressure-sensitive rubber layer by the moving mechanism, a part of the pressure-sensitive rubber layer is contacted with the conductive pattern of the specimen As a result, the part of the pressure-sensitive rubber layer, which is contacted with the conductive pattern of the specimen, causes electric conduction among corresponding ones of the main electrodes of the main electrode roller.

Thus, the conductive pattern of the specimen is accurately recognized by using the conduction detector and the rotation detector. This recognition is independent of the material and the surface state of the conductive pattern, because it is sufficient that the part of the pressure-sensitive rubber layer realizes electric conduction among the corresponding ones of the main electrodes of the main electrode roller. This is unlike the conventional conductive-pattern recognition apparatus shown in FIG. 2 where the pattern itself of change of the current or electric resistance due to the contact with the conductive pattern is important.

Also, since the pattern matching procedure is not utilized, recognition errors are prevented from occurring even if the conductive pattern is complex.

Moreover, because it is sufficient that the part of the pressure-sensitive rubber layer, which is contacted with the conductive pattern of the specimen, realizes electric conduction among the corresponding ones of the main electrodes of the main electrode roller. Accordingly, not only a conductive pattern protruding from its neighborhood but also a conductive pattern depressed from or leveled with its neighborhood can be recognized.

In a preferred embodiment of the apparatus according to the first aspect of the present invention, the conduction detector is comprised of a sub electrode roller and a sliding electrode.

The sub electrode roller is formed by circular sub electrodes and circular insulators arranged alternately along a straight line and coupled together. The sub electrode roller is arranged to be contacted with the pressure-sensitive rubber layer under a pressure, thereby electrically connecting the sub electrodes of the sub electrode roller to the individual main electrodes of the main electrode roller through the pressure-sensitive rubber layer.

The sliding electrode has sliding conductive pieces arranged to be contacted with the individual sub electrodes of the sub electrode roller.

In this case, it is preferred that the sub electrodes of the sub electrode roller and the sliding conductive pieces of the sliding electrode have a same pitch as the main electrodes of the main electrode roller In another preferred embodiment of the apparatus according to the first aspect of the present invention, the rotation detector has a rotary encoder rotated synchronously with the main electrode roller.

In this case, it is preferred that the rotary encoder is directly fixed to the rotation axis of the main electrode roller or indirectly fixed to the main electrode roller through at lease one additional roller.

In still another preferred embodiment of the apparatus according to the first aspect of the present invention, the conduction detector has a detection circuit.

The detection circuit has functions of converting electric currents flowing through current paths formed by respective adjacent ones of the main electrodes of the main electrode roller to output voltages, comparing the output voltages with a reference voltage, and generating a two-valued output signals according to a result of comparison.

A conductive-pattern recognition apparatus according to a second aspect of the present invention is comprised of (a) a main electrode roller formed by circular main electrodes and circular insulators arranged alternately along a straight line and coupled together, (b) a pressure-sensitive rubber layer fixed onto an outer surface of the main electrode roller and contacted with the main electrodes and the insulators of the main electrode roller, (c) a moving mechanism for moving a specimen with a conductive pattern in a direction perpendicular to a rotation axis of the main electrode roller so that the specimen applies a pressure to the pressure-sensitive rubber layer, (d) a conduction detector for detecting electric conduction of at least one of the main electrodes of the main electrode roller through the pressure-sensitive rubber layer, and (e) a rotation detector for detecting a rotation amount of the main electrode roller.

When a part of the pressure-sensitive rubber layer is contacted with the conductive pattern of the specimen, the part of the pressure-sensitive rubber layer causes electric conduction of at least one of the main electrodes of the main electrode roller. Thus, the conductive pattern of the specimen is recognized by using the conduction detector and the rotation detector.

With the conductive-pattern recognition apparatus according to the present invention, the main electrode roller is formed by the circular main electrodes and the circular insulators arranged alternately along a straight line and coupled together. The pressure-sensitive rubber layer is fixed onto the outer surface of the main electrode roller and is contacted with the main electrodes and the insulators of the main electrode roller.

Therefore, when a specimen with a conductive pattern is moved in a direction perpendicular to the rotation axis of the main electrode roller so that the specimen applies a pressure to the pressure-sensitive rubber layer by the moving mechanism, a part of the pressure-sensitive rubber layer is contacted with the conductive pattern of the specimen. As a result, the part of the pressure-sensitive rubber layer, which is contacted with the conductive pattern of the specimen, causes electric conduction of the at least one of the main electrodes of the main electrode roller.

Thus, the conductive pattern of the specimen is accurately recognized by using the conduction detector and the rotation detector. This recognition is independent of the material and the surface state of the conductive pattern, because it is sufficient that the part of the pressure-sensitive rubber layer realizes electric conduction of at least one of the main electrodes of the main electrode roller. This is unlike the conventional conductive-pattern recognition apparatus shown in FIG. 2.

Also, since the pattern matching procedure is not utilized, recognition errors are prevented from occurring even if the conductive pattern is complex.

Moreover, because it is sufficient that the part of the pressure-sensitive rubber layer, which is contacted with, the conductive pattern of the specimen, realizes electric conduction of at least one of the main electrodes of the main electrode roller. Accordingly, not only a conductive pattern protruding from its neighborhood but also a conductive pattern depressed from or leveled with its neighborhood can be recognized.

In a preferred embodiment of the apparatus according to the second aspect of the present invention, the conduction detector is comprised of a current-supplying electrode and a sliding electrode.

The current-supplying electrode includes current-supplying conductors arranged on a periphery of the main electrode roller at a specified pitch not to be contacted with the main electrodes. The current-supplying electrodes extend along the rotation axis of the main electrode roller.

The current-supplying electrode further includes a conductive contact piece slidingly contacted with one of the current-supplying conductors.

The sliding electrode has sliding conductive pieces arranged to be contacted with the individual main electrodes of the main electrode roller.

In this case, it is preferred that the sliding electrode is fixed inside the main electrode roller.

Also, it is preferred that the sliding conductive pieces of the sliding electrode have a same pitch as the main electrodes of the main electrode roller.

In another preferred embodiment of the apparatus according to the second aspect of the present invention, each of the main electrodes has gear-like teeth arranged around at a pitch. Spaces between adjacent ones of the teeth of the main electrode are filled with insulators, thereby electrically insulating the main electrodes from the current-supplying conductors of the current-supplying electrode.

In still another preferred embodiment of the apparatus according to the second aspect of the present invention, the rotation detector has a rotary encoder rotated synchronously with the main electrode roller.

In this case, it is preferred that the rotary encoder is directly fixed to the rotation axis of the main electrode roller or indirectly fixed to the main electrode roller through at lease one additional roller.

In a further preferred embodiment of the apparatus according to the second aspect of the present invention, the conduction detector has a detection circuit.

The detection circuit has functions of converting electric currents flowing through current paths formed by respective adjacent ones of the main electrodes of the main electrode roller to output voltages, comparing the output voltages with a reference voltage, and generating a two-valued output signals according to a result of comparison.

BRIEF DESCRIPTION OF THE DRAWINGS

In order that the present invention maybe readily carried into effect, it will now be described with reference to the accompanying drawings.

DETAILED DESCRIPTION OF THE PREFERRED EMBODIMENTS

Figure 1:
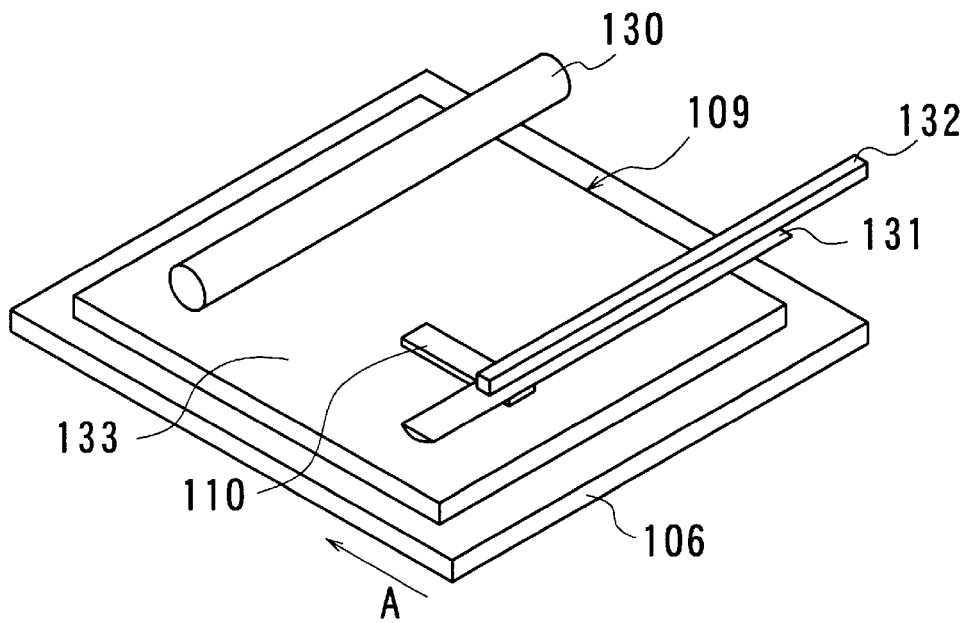
FIG. 1 is a schematic illustration of a conventional conductive-pattern recognition apparatus, which recognizes optically a conductive patterns of a PWB.

Preferred embodiments of the present invention will be described in detail below while referring to the drawings attached.

FIRST EMBODIMENT

Figure 5:
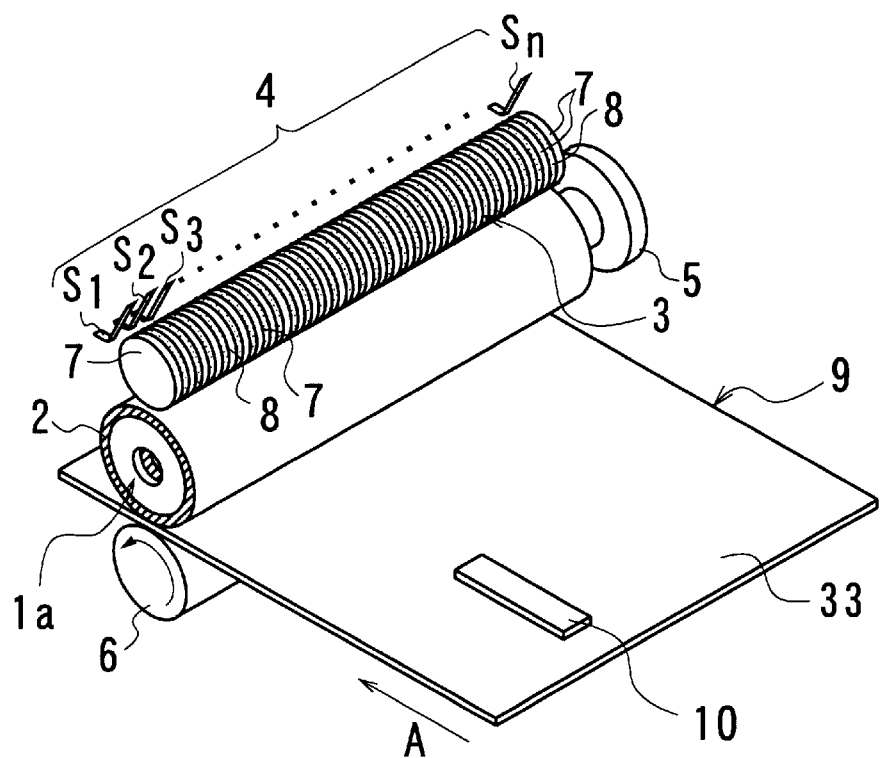
FIG. 5 is a schematic perspective illustration of a conductive-pattern recognition apparatus according to a first embodiment of the present invention.

As shown in FIG. 5, a conductive-pattern recognition apparatus according to a first embodiment of the present invention is comprised of a main electrode roller 1a, a pressure-sensitive rubber layer 2 fixed onto the outer surface of the main electrode roller 1a, a sub electrode roller 3 rotatably fixed over the main electrode roller 1a, a sliding electrode 4 fixed over the sub electrode roller 3, and a driving roller 6 rotatably fixed below the main electrode roller 1a. These three rollers 1a, 3, and 6 and the sliding electrode 4 are arranged in parallel.

Figure 6:
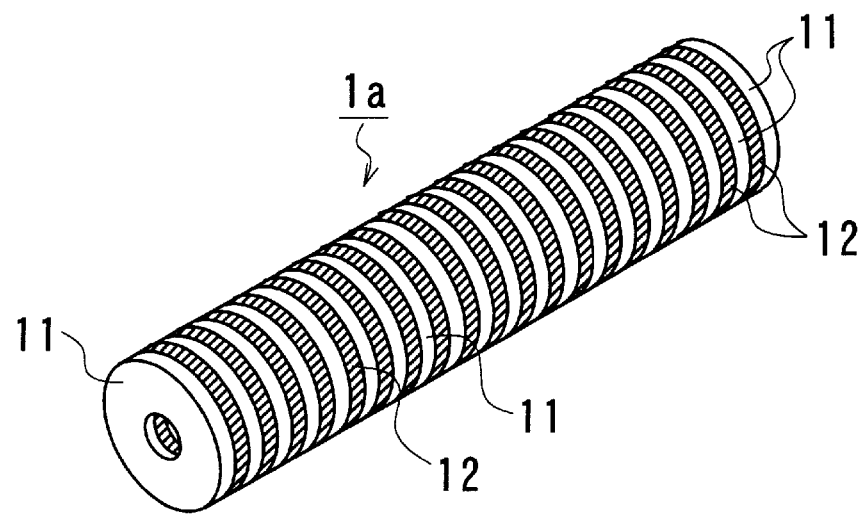
FIG. 6 is a schematic perspective illustration of a main electrode roller used in the conductive-pattern recognition apparatus according to the first embodiment of FIG. 5.

As shown in FIG. 6, the main electrode roller 1a is formed by conductive rings 11 and insulating rings 12 arranged alternately along the axis of the roller 1a. The conductive rings 11 and insulating rings 12 thus alternately arranged are fixed together to form a cylindrical shape. The insulating rings 12 serve to form gaps between adjacent ones of the conductive rings 11. The conductive rings 11 serve as main electrodes.

As shown in FIG. 5, a rotary encoder S is coaxially fixed to the main electrode roller 1a. The rotary encoder 5 detects the rotational angle of the roller 1a and calculates the rotational position or distance of the roller 1a based on the product of the radius of the roller 1a and the rotational angle thus detected.

Figure 7:
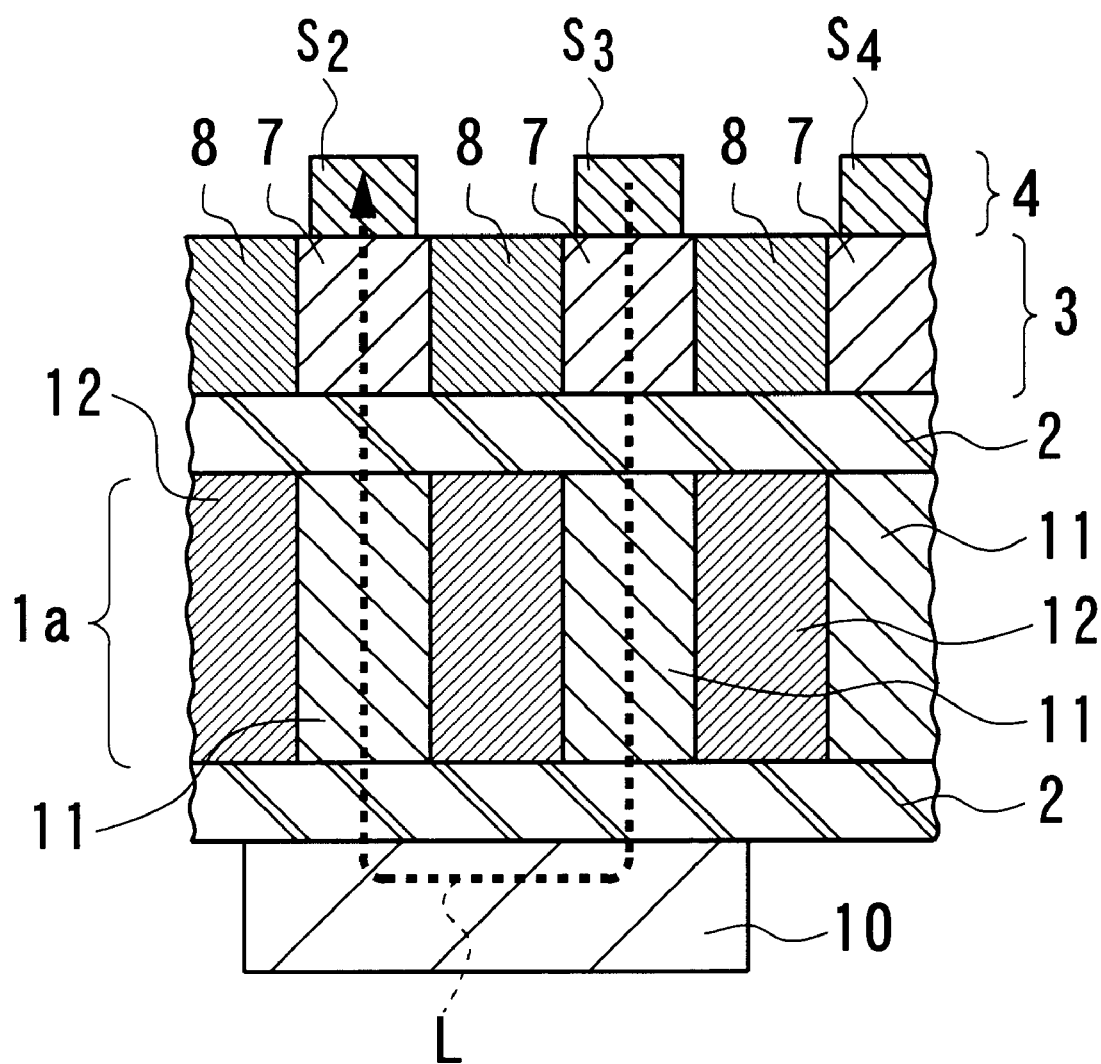
FIG. 7 is an enlarged schematic view showing the closed circuit formed by the electrode roller, the converter electrodes, , and the conductive pattern of a PWB to be recognized in the conductive-pattern recognition apparatus according to the first embodiment of FIG. 5.

The sub electrode roller 3 has a similar configuration as that of the main electrode roller 1a. Specifically, as shown in FIG. 7, the sub electrode roller 3 is formed by conductive rings 7 and insulating rings 8 arranged alternately along the axis of the roller 3. The conductive rings 7 and insulating rings 8 thus alternately arranged are fixed together to form a cylindrical shape, which have a same pitch as that of the main electrode roller 1a. The insulating rings 8 serve to form gaps between adjacent ones of the conductive rings 7. The conductive rings 7 serve as sub electrodes.

Since the conductive rings 7 of the sub electrode roller 3 have a same pitch as that of the conductive rings 11 of the main electrode roller 1a, each of the conductive rings 7 is opposite to a corresponding one of the conductive rings 11 through the corresponding part of the intervening pressure-sensitive conductive rubber layer 2, as shown in FIG. 7.

As shown in FIGS. 5 and 7, the outer surface of the sub electrode roller 3 is contacted with the pressure-sensitive rubber layer 2 of the main electrode roller 1a under a pressure. Thus, the main electrodes 11 of the main electrode roller 1a are always electrically connected to the respective sub electrodes 7 of the sub electrode roller 3 through the corresponding positions of the pressure-sensitive rubber layer 2.

The pressure-sensitive conductive rubber layer 2 is applied with a pressure by a conductive pattern 10 formed on a PWB 9 to be inspected (i.e., a specimen) Due to this pressure, a conductive path or paths perpendicular to the layer 2 (i.e., in the radial direction) is or are selectively generated in the layer 2 at the pressure-applied position or positions. Thus, at least two ones of the conductive rings or main electrodes 11 of the main electrode roller 1a are electrically connected to the corresponding sub electrodes 7 of the sub electrode roller 3 through the conductive pattern 10 and the pressure-applied position or positions of the layer 2.

The sliding electrode 4 has sliding conductive pieces $S_1$ to $S_n$ fixed to a supporting member (not shown) at regular intervals along the axis of the electrode 4, as shown in FIG. 5. The conductive pieces $S_1$ to $S_n$ are contacted with the corresponding conductive rings or sub electrodes 7 of the sub electrode roller 3, as clearly shown in FIG. 7. Thus, the sub electrodes 7 of the sub electrode roller 3 are rotated in contact with the respective conductive pieces $S_1$ to $S_n$ of the sliding electrode 4.

Figure 8:
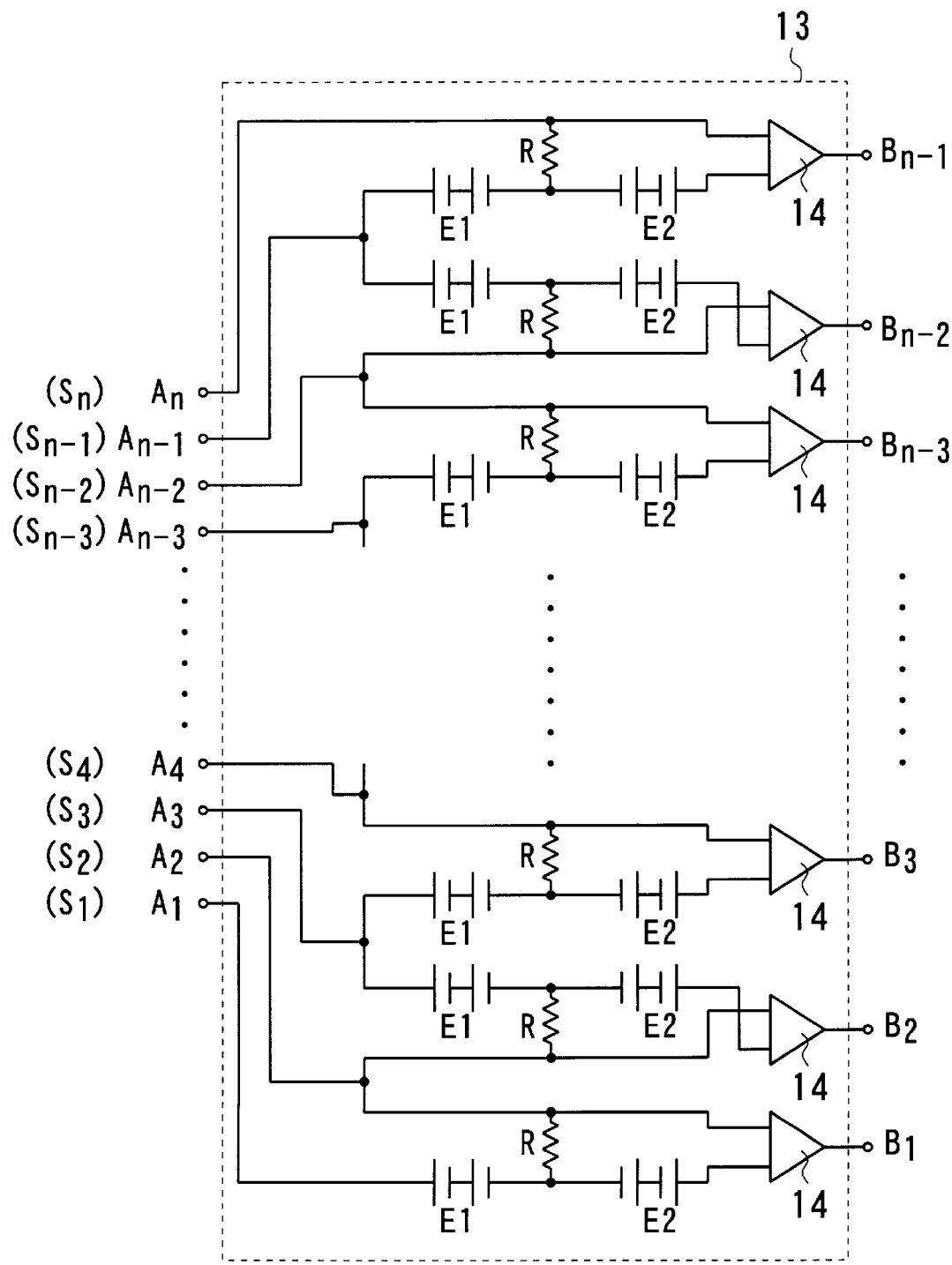
FIG. 8 is a circuit diagram of the detection circuit in the conductive-pattern recognition apparatus according to the first embodiment of FIG. 5.

The sliding electrode 4 serves to take out the detected signal by the main electrode roller 1a and to apply the signal to a detection circuit 13 shown in FIG. 8.

The driving roller 6 of the moving or translating mechanism and the main electrode roller 1a are arranged to sandwich the specimen PWB 9 therebetween. Due to the rotation of the driving roller 6, the PWB 9 is moved or translated under pressure in a horizontal moving direction A.

The detection circuit 13 has the configuration shown in FIG. 8.

In FIG. 8, input terminals $A_1$ to $A_n$ of the detection circuit 13 are electrically connected to the sliding conductive pieces $S_1$ to $S_n$, respectively. The reference symbol E1 denotes constant voltage sources serving as current suppliers. The reference symbol R denotes resistors serving as current-to-voltage converters. The reference symbol E2 denotes constant voltage sources serving as constant voltage generators. The reference symbol 14 denotes comparators serving as voltage comparators.

Here, for example, it is supposed that the constant voltage sources E1 have a same supply voltage of 10 V, the resistors R have a same resistance of 100 Ω, the constant voltage sources E2 have a same supply voltage of 5 V, and the comparators 14 have a same output amplitude of 0 to 10 V.

In this case, for example, if the electrodes $S_n$ and $S_{n-1}$ of the sub electrode roller 3 become conductive at an electric resistance less than 100 Ω, a current flowing through the resistor R connected between the two lines connected to the input terminals $A_n$ and $A_{n-1}$ is 50 to 100 mA. Thus, the inter-terminal voltage of the resistor R in question is equal to 5 to 10 V, which is applied across a pair of input terminals of a corresponding one of the comparators 14. Here, a reference voltage of this comparator 14 is 5 V, and therefore, the input voltage becomes equal to or greater than the reference voltage. As a result, the output voltage of this comparator 14 is zero (0) V.

On the other hand, if the electrodes $S_n$ and $S_{n-1}$ of the sliding electrode 3 become conductive at an electric resistance greater than 100 Ω, an electric current flowing through the resistor R connected between the two lines connected to the input terminals $A_n$ and $A_{n-1}$ is less than 50 mA. Thus, the inter-terminal voltage of the resistor R in question is less than 5 V, which is applied across the pair of input terminals of the corresponding comparator 14. Since the reference voltage of this comparator 14 is 5 V, the input voltage becomes less than the reference voltage As a result, the output voltage of this comparator 14 is 10 V.

As explained above, the detection circuit 13 judges whether the electric resistance between the electrodes $S_n$ and $S_{n-1}$ is greater than 100 Ω or not and produces the output voltage of 0 or 10 V according to the result of this judgment.

Next, the operation of the conductive-pattern recognition apparatus according to the first embodiment shown in FIG. 5 is explained below.

The PWB 9 to be inspected has a surface covered with an insulating layer 33 except for the conductive pattern 10. When a leading end of the PWB 9 is inserted into the gap between the main electrode roller 1a and the driving roller 6, the PWB 9 is moved or translated in the moving direction A due to the rotation of the roller 6 while the PWB 9 is applied with a pressure. At this stage, the pressure-sensitive rubber layer 2 of the main electrode roller 1a is changed in shape.

If the conductive pattern 10 of the PWB 9 is contacted with the pressure-sensitive rubber layer 2 of the main electrode roller 1a, a closed circuit L is formed, as shown in FIG. 7. This closed circuit L is formed by the conductive piece S3 of the sliding electrode 4, the corresponding conductive ring or sub electrode 7 of the sub electrode roller 3, the pressure-sensitive rubber layer 2, the corresponding conductive ring or main electrode 11 of the main electrode roller 1a, the pressure-sensitive rubber layer 2, the conductive pattern 10 of the PWB 9, the pressure-sensitive rubber layer 2, the corresponding main electrode 11 of the main electrode roller 1a, the pressure-sensitive rubber layer 2, the corresponding sub electrode 7 of the sub electrode roller 3, and the conductive piece S2 of the sliding electrode 4.

Thus, the profile or shape of the conductive pattern 10 is recognized based on the position of the conductive pattern 10 at which the closed circuit L or conductive path is formed and the rotational position or distance of the main electrode roller 1a which is given through the rotational angle from the rotary encoder 5.

With the conductive-pattern recognition apparatus according to the first embodiment shown in FIG. 5, the main electrode roller 1a is formed by the circular main electrodes 11 and the circular insulators 12 arranged alternately along a straight line and coupled together. The pressure-sensitive rubber layer 2 is fixed onto the outer surface of the main electrode roller 1a and is contacted with the main electrodes 11 and the insulators 12 of the main electrode roller 1a.

Therefore, when the specimen PWB 9 with the conductive pattern 10 is moved in the moving direction A perpendicular to the rotation axis of the main electrode roller 1a so that the specimen PWB 9 applies a pressure to the pressure-sensitive rubber layer 2 by the driving roller 6 of the moving mechanism, the part of the pressure-sensitive rubber layer 2 is contacted with the conductive pattern 10 of the specimen PWB 9. As a result, the part of the pressure-sensitive rubber layer 2, which is contacted with the conductive pattern 10 of the PWB 9, causes electric conduction among corresponding ones of the main electrodes 11 of the main electrode roller 3.

Figure 2:
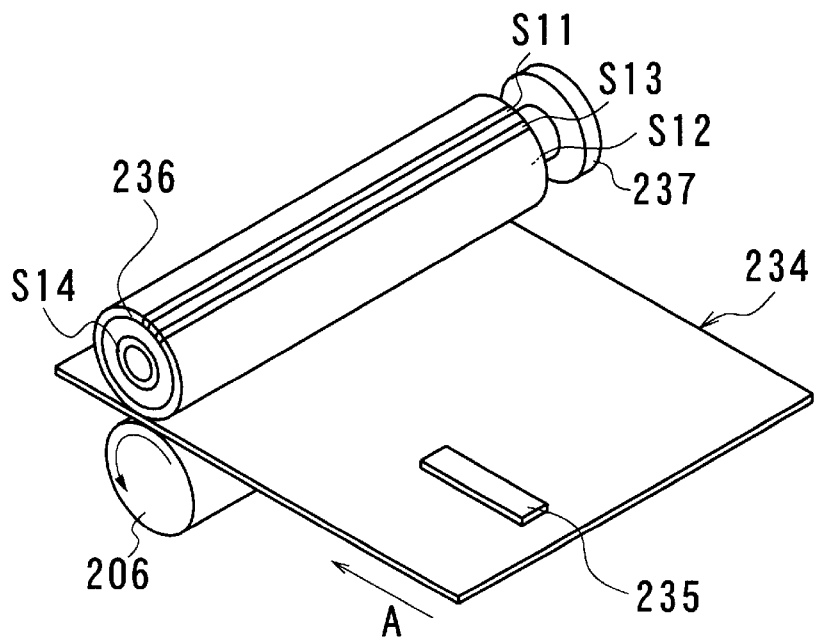
FIG. 2 is a schematic illustration of another conventional conductive-pattern recognition apparatus, which is an embossed-character reader.
Figure 3:
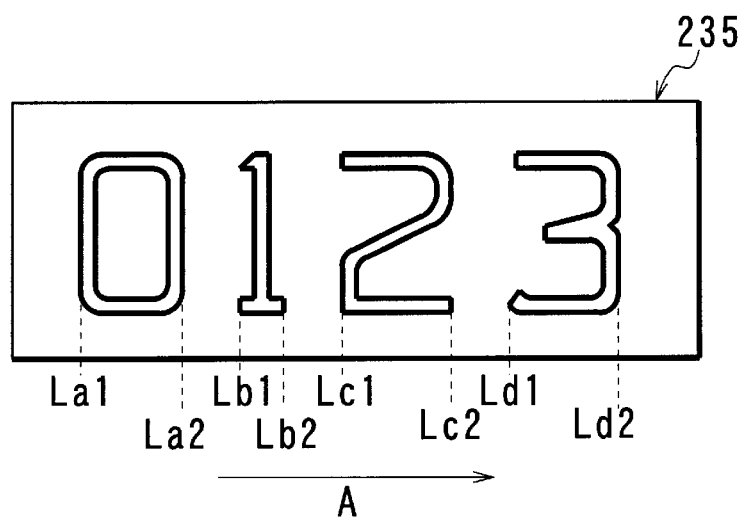
FIG. 3 is a schematic illustration of an example of embossed characters used in the conventional conductive-pattern recognition apparatus shown in FIG. 2.
Figure 4:
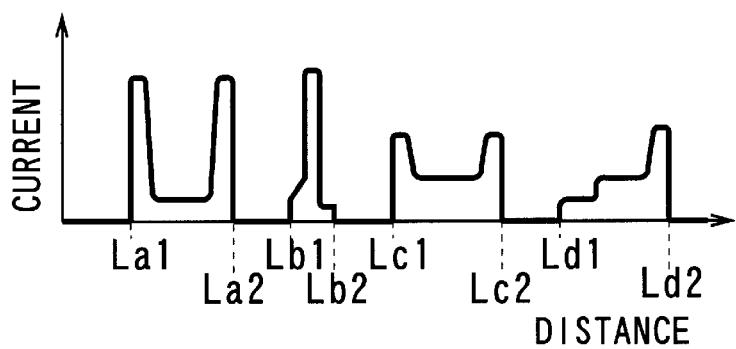
FIG. 4 is a schematic diagram showing a pattern of an electric current obtained by the embossed characters shown in FIG. 3.

Thus, the conductive pattern 10 of the specimen PWB 9 is accurately recognized by using the sub electrode roller 3, the sliding electrode 4, the detection circuit 13, and the rotary encoder 5. This recognition is independent of the material and the surface state of the conductive pattern 10, because it is sufficient that the part of the pressure-sensitive rubber layer 2 realizes electric conduction among the corresponding ones of the main electrodes 11 of the main electrode roller 1a. This is unlike the conventional conductive-pattern recognition apparatus shown in FIG. 2 where the pattern itself of change of the current or electric resistance due to the contact with the conductive pattern is important.

Also, since the pattern matching procedure is not utilized, recognition errors are prevented from occurring even if the conductive pattern 10 is complex.

Moreover, because it is sufficient that the part of the pressure-sensitive rubber layer 2, which is contacted with the conductive pattern 10 of the specimen PWB 9, realizes electric conduction among the corresponding ones of the main electrodes 11 of the main electrode roller 1a. Accordingly, not only a conductive pattern protruding from its neighborhood but also a conductive pattern depressed from or leveled with its neighborhood can be recognized.

Figure 11:
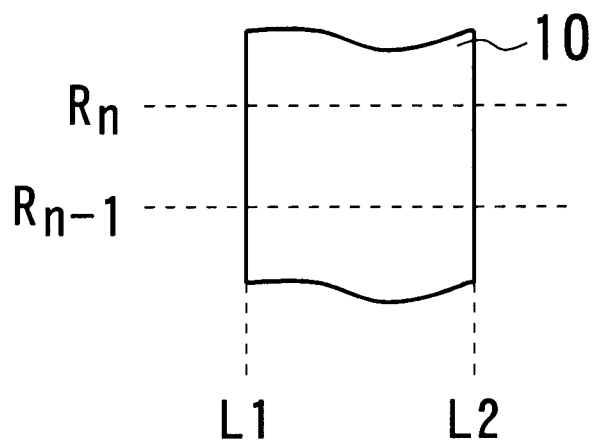
FIG. 11 is an enlarged, partial view of the conductive pattern used in the conductive-pattern recognition apparatus according to the first embodiment of FIG. 5.
Figure 12:
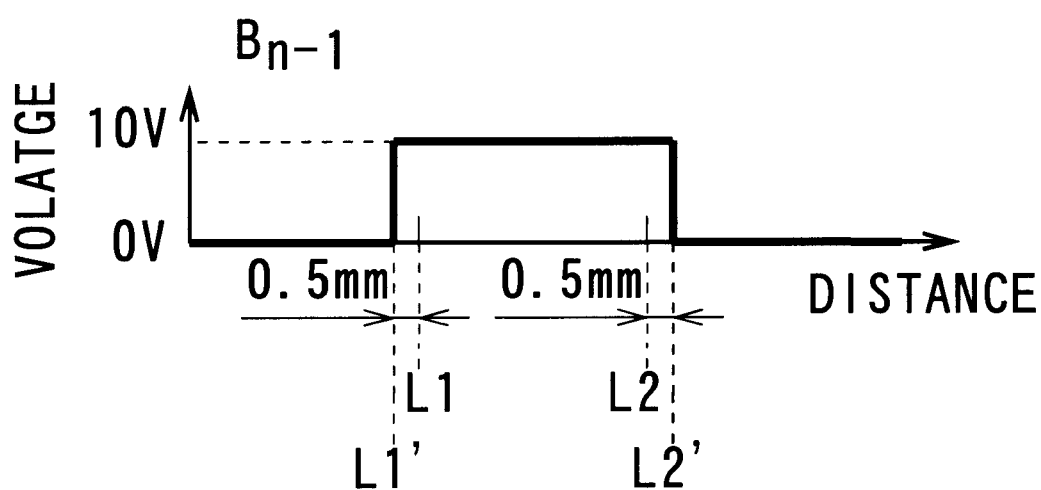
FIG. 12 is an enlarged, partial schematic waveform diagram of the output voltage obtained by the conductive pattern shown in FIG. 9.

In the conductive-pattern recognition apparatus according to the first embodiment shown in FIG. 5, the pressure-sensitive rubber layer 2 is in area contact with the conductive pattern 10 of the PWB 9, which is not in linear contact therewith. Therefore, as shown in FIGS. 11 and 12, distance errors exist.

A first one of the distance errors is caused by the fact that a time shift (i.e., time advance) arises between the time at which the pressure-sensitive rubber layer 2 is contacted with the conductive pattern 10 and the time at which the conductive path or paths is/are formed by the main and sub electrode rollers 1a and 3 and the conductive pattern 10.

A second one of the distance errors is caused by the fact that a time shift (time delay) arises between the time at which the conductive path or paths formed by the main and sub electrode rollers 1a and 3 and the conductive pattern 10 disappears and the time at which the pressure-sensitive rubber layer 2 is separated from the conductive pattern 10.

To confirm the advantages of the present invention, the inventor performed the tests under the following condition.

A conductive-pattern recognition apparatus was fabricated according to the first embodiment.

Specifically, 501 stainless steel rings with a thickness of 0.1 mm as the conductive rings or main electrodes 11 and 500 epoxy resin rings with a thickness of 0.1 mm as the insulating rings 12 were alternately arranged along a straight line and were adhered together, thereby forming the main electrode roller 1a with a total length of 100.1 mm, a diameter of 50 mm, and an axial insulating-gap pitch of 0.2 mm.

The pressure-sensitive rubber layer 2 was formed by a silicone rubber with a thickness of 0.4 mm, in which conductive particles with a particle size of 20 μm were uniformly dispersed.

An obtainable minimum resolving power of the main electrode roller 1a with the pressure-sensitive rubber layer 2 was 50 μm.

On the other hand, 501 stainless steel rings with a thickness of 0.1 mm as the conductive rings or sub electrodes 7 and 500 epoxy resin rings with a thickness of 0.1 mm as the insulating rings 8 were alternately arranged along a straight line and were adhered together, thereby forming the converter electrode roller 3 with a total length of 100.1 mm, a diameter of 30 mm, and an axial insulating-gap pitch of 0.2 mm.

Each of the sliding conductive pieces S1 to Sn of the sliding electrode 4 was formed by a phosphor bronze strip with a thickness of 0.05 mm, a width of 0.1 mm, and a length of 3 mm. These phosphor bronze strip were arranged at a pitch of 0.2 mm onto the supporting member (not shown).

Figure 9:
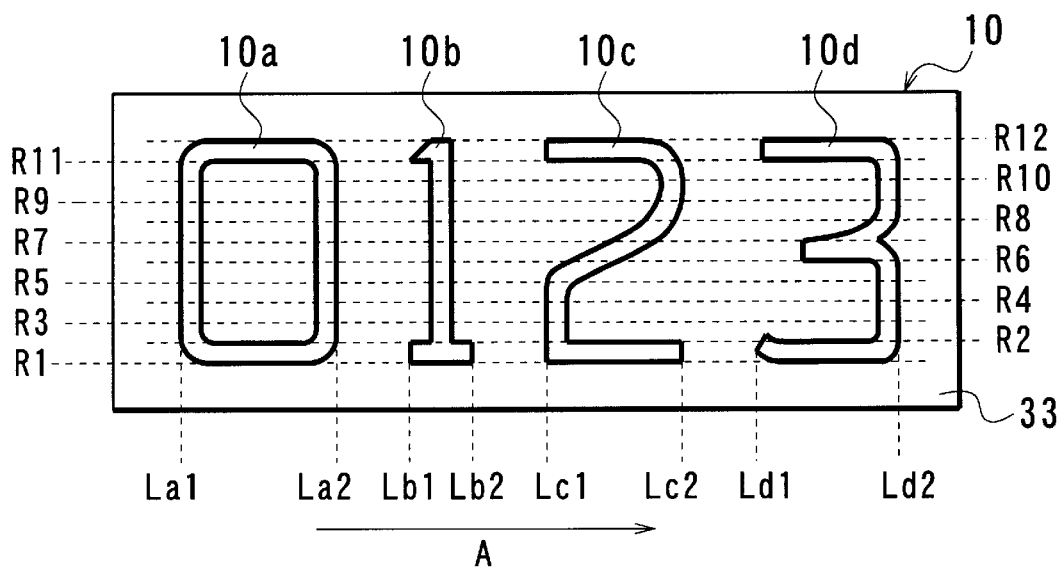
FIG. 9 is a schematic illustration of an example of a conductive pattern used in the conductive-pattern recognition apparatus according to the first embodiment of FIG. 5.

The conductive pattern 10 of the PWB 9, a thickness of which is 0.4 mm, has four sub-patterns 10a, 10b, 10c, and 10d, as shown in FIG. 9. In FIG. 9, the symbols $R_1$ to $R_{12}$ denotes scanning routes along which the conductive rings or main electrodes 11 of the main electrode roller 1a are scanned during the recognition operation.

The specimen PWB 9 was moved in the direction A at a speed of 50 mm/sec while the surface of the PWB 9 was applied with a pressure 5 kg/cm$^2$. The leading edge of the PWB 9 was inserted into the gap between the main electrode roller 1a and the driving roller 6 and then, the whole PWB 9 was passed through the gap in the direction A. As a result, the output signals generated at the output terminals $B_1$ to $B_{11}$ of the detection circuit 13 had the waveforms as shown in FIG. 10.

Figure 10:
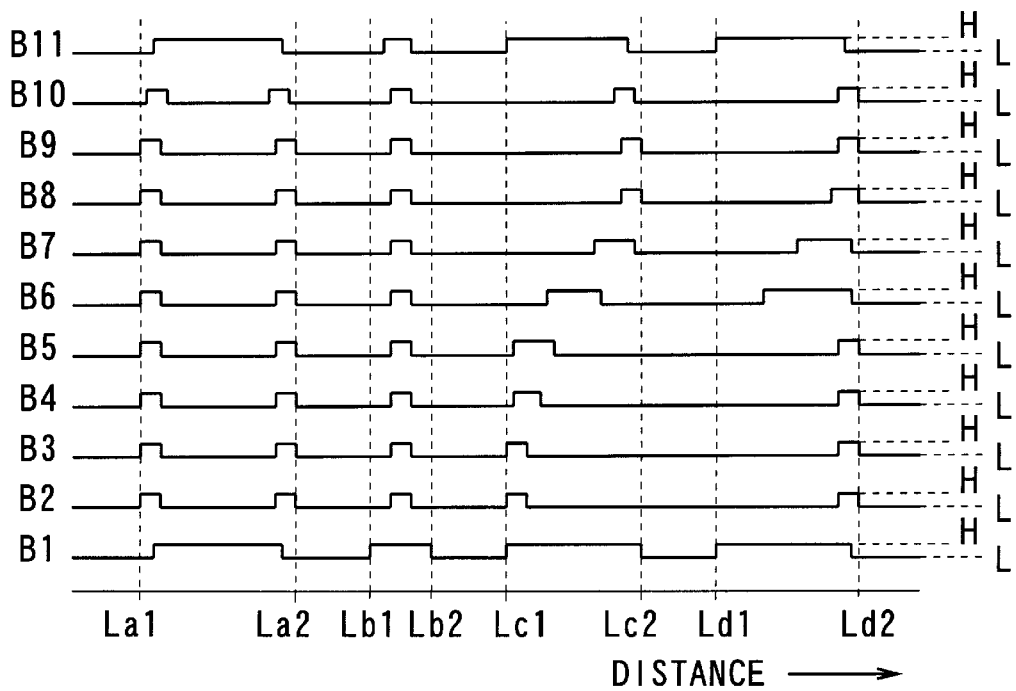
FIG. 10 is a schematic waveform diagram showing patterns of an electric current (or, output voltage) obtained by the conductive pattern shown in FIG. 9.

It is seen from FIG. 10 that the output signals were turned from the logic low state L to the logic high state H or from the logic high state H to the logic low state L corresponding to the sub-patterns 10a, 10b, 10c, and 10d of the conductive pattern 10 of the PWB 9. The symbols La1, La2, Lb1, Lb2, Lc1, Lc2, and Ld1, and Ld2 shown in FIG. 9 are typical edges of the sub-patterns 10a, 10b, 10c, and 10d. Using the waveforms of the two-valued output signals thus obtained, the profile or shape of the sub-patterns 10a, 10b, 10c, and 10d of the conductive pattern 10 were recognized accurately.

The distance errors were as follows.

The time advance and time delay were equal to or less than 10 msec if the moving or translation speed of the PWB 9 was set as 50 mm/sec. Therefore, as shown in FIGS. 11 and 12, the distance error $\Delta L1$ (=|L1−L1'|) corresponding to the time advance and the distance error $\Delta L2$ (=|L2−L2'|) corresponding to the time delay were both 0.5 mm.

Therefore, in the confirmation test, the recognized width of each of the sub-patterns 10a, 10b, 10c, and 10d was longer than their practical width by 1.0 mm (=0.5 mm×2). As a result, the minimum resolving power along the moving direction A was 1 mm and the minimum resolving power perpendicular to the moving direction A was 0.2 mm.

SECOND EMBODIMENT

Figure 13:
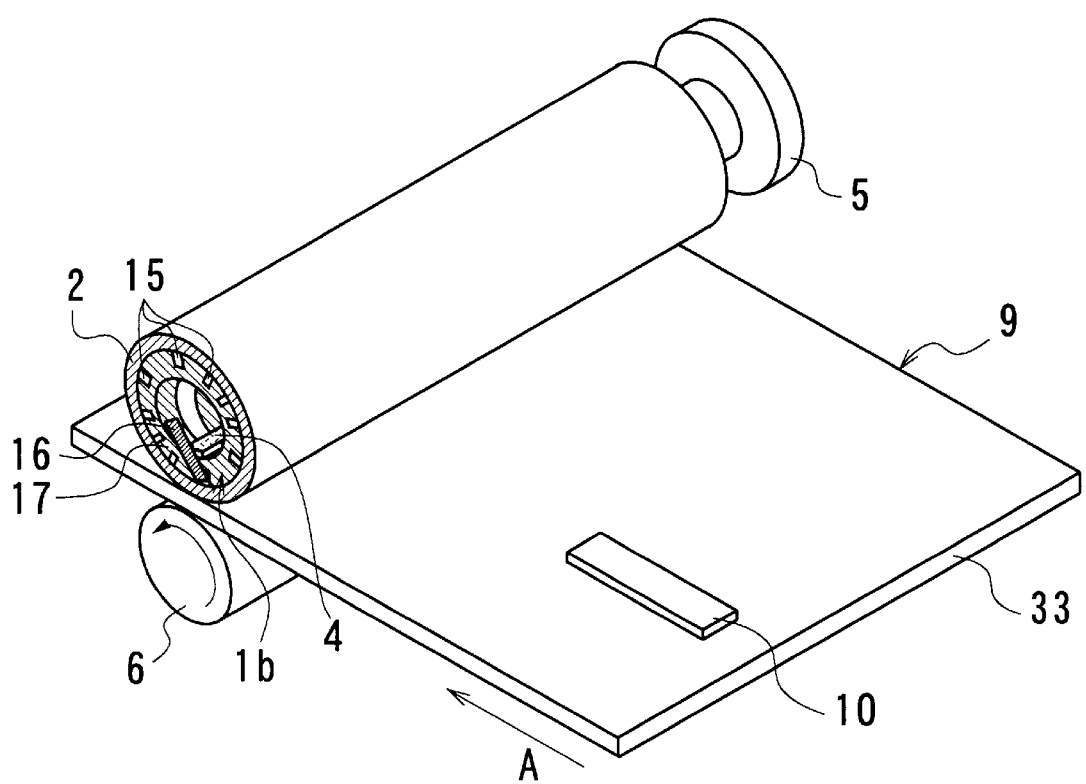
FIG. 13 is a schematic perspective illustration of a conductive-pattern recognition apparatus according to a second embodiment of the present invention.

FIG. 13 shows a conductive-pattern recognition apparatus according to a second embodiment of the present invention, which improves the resolving power perpendicular to the moving direction A compared with the first embodiment.

The conductive-pattern recognition apparatus according to the second embodiment has substantially the same configuration and operation as those of the first embodiment except for the following difference.

Figure 14:
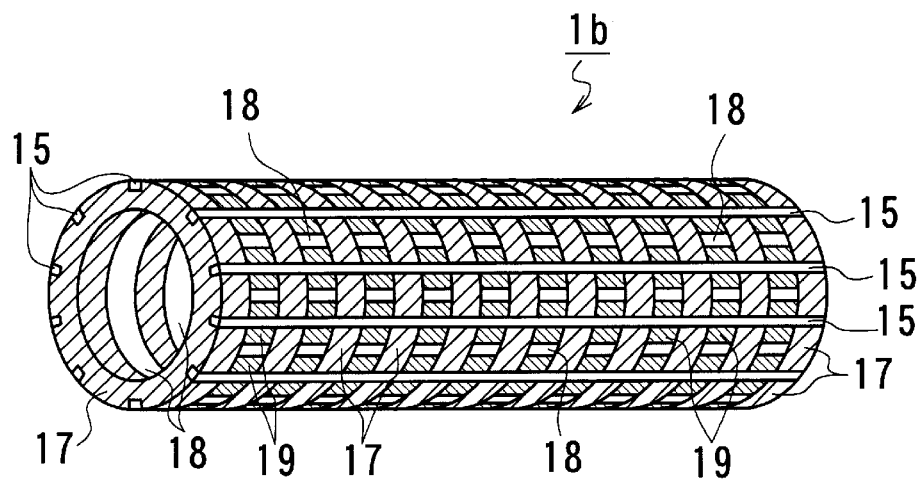
FIG. 14 is a schematic perspective illustration of a main electrode roller used in the conductive-pattern recognition apparatus according to the second embodiment of FIG. 13.
Figure 15:
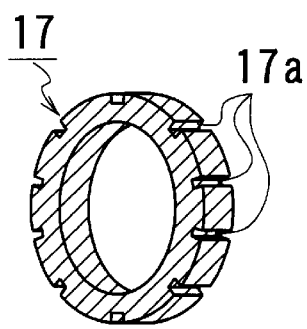
FIG. 15 is a schematic perspective illustration of a ring-shaped insulator to form a gap between adjacent detection electrodes used in the conductive-pattern recognition apparatus according to the second embodiment of FIG. 13.

First, a main electrode roller 1b with the configuration shown in FIG. 14 is provided instead of the main electrode roller 1a in the first embodiment. Second, the sub electrode roller 3 is not used. Third, the sliding electrode 4 is located in the hollow cylindrical space of the main electrode roller 1b.

The main electrode roller 1b is formed by bar-shaped current-supplying electrodes 15, ring-shaped insulators 17, ring-shaped conductors 18, and segment-shaped insulators 19, as shown in FIGS. 15, 16, 17, and 18.

Each of the ring-shaped insulators 17 has recesses 17a arranged on its outer surface at regular intervals, into which the bar-shaped current-supplying electrodes 15 are inserted, as shown in FIG. 14.

Figure 16:
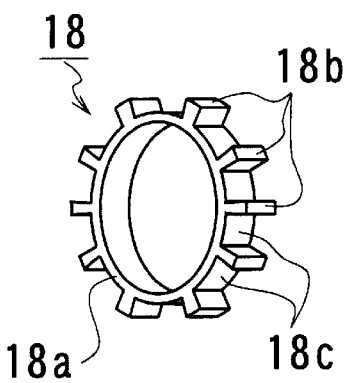
FIG. 16 is a schematic perspective illustration of a ring-shaped main electrode used in the conductive-pattern recognition apparatus according to the second embodiment of FIG. 13.

As shown in FIG. 16, each of the ring-shaped conductors 18 has teeth 18b protruding radially from a circular-ringed core 18a and arranged at regular intervals like a spur gear. Recesses 18c, which are formed outside the core 18a between adjacent ones of the teeth 18b, receive the segment-shaped insulators 19. The recesses 18c are filled with the insulators 19.

Figure 17:
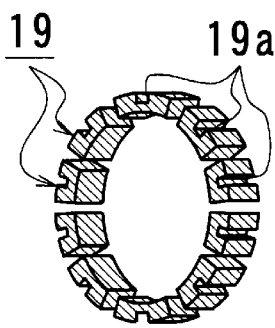
FIG. 17 is a schematic perspective illustration of a segment-shaped insulator to form a gap between adjacent main electrodes used in the conductive-pattern recognition apparatus according to the second embodiment of FIG. 13.

As shown in FIG. 17, each of the seagment-shaped insulators 19 has a recess 19a into which a corresponding one of the bar-shaped supply electrodes 15 is inserted. Ten insulators 19 are used for each conductor 16 in this embodiment. These insulators 19 serve to improve the resolving power along the moving direction A of the PWB 9 to be inspected.

Figure 18:
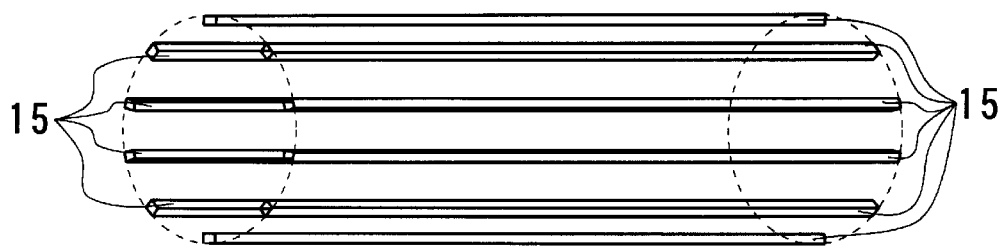
FIG. 18 is a schematic perspective illustration showing the layout of linear supply electrodes used in the conductive-pattern recognition apparatus according to the second embodiment of FIG. 13.
Figure 19:
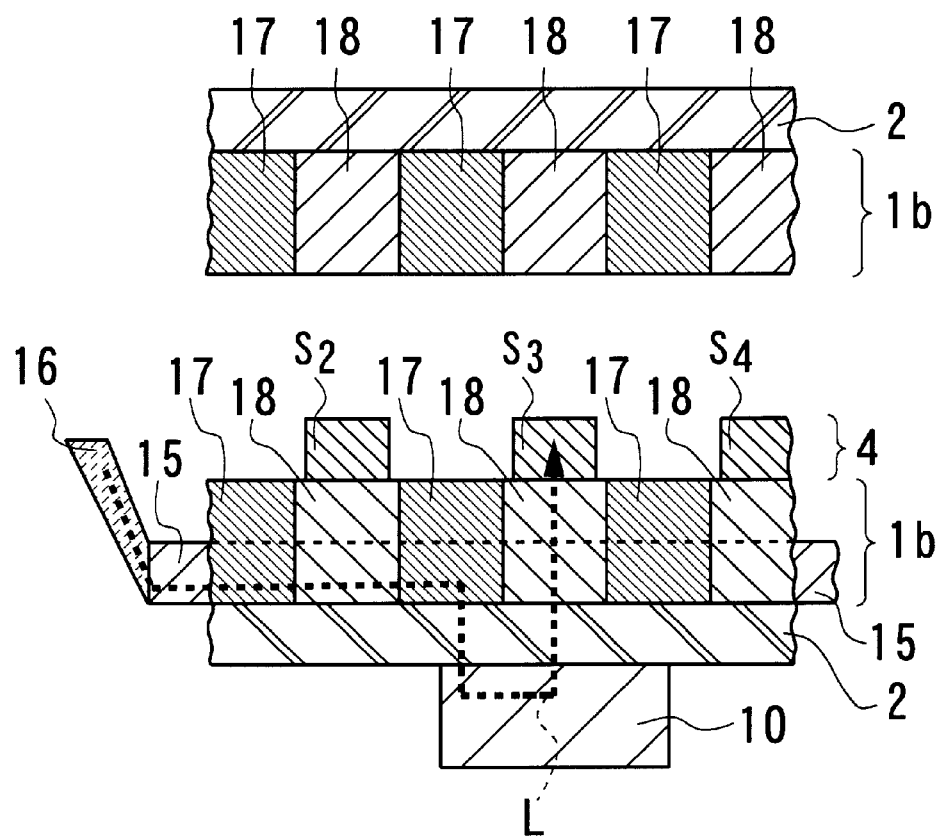
FIG. 19 is a. enlarged schematic view showing the closed circuit formed by the electrode roller, the converter electrodes, and the conductive pattern of a PWB to be recognized in the conductive-pattern recognition apparatus according to the second embodiment of FIG. 13.

The bar-shaped current-supplying electrodes 15 are arranged in parallel to extend along the rotation axis of the main electrode roller 1b, as clearly shown in FIG. 18

As shown in FIG. 14, the main electrode roller 1b is formed by the conductive rings 18 attached with the segment-shaped insulators 19 and the insulating rings 17 arranged alternately along the axis of the roller 1b. The conductive rings 18 and the insulating rings 17 thus alternately arranged are fixed together to form a cylindrical shape. The insulating rings 17 serve to form axial insulating gaps between adjacent ones of the conductive rings 18. The segment-shaped insulators 19 serve to form circumferential gaps along the circumferential direction of the roller 1b.

A current-supplying sliding electrode 16 is additionally provided in such a way that one of the current-supplying electrodes 15 of the main electrode roller 1b, which is located at the lowest position, is contacted with the sliding electrode 16 and selectively applied with an electric current through the electrode 16. The electrode 16 is fixed outside the main electrode roller 1b in the vicinity of an opening end of the main electrode roller 1b opposite to the rotary encoder 5.

The sliding electrode 4 with the same configuration as the first embodiment is located in the cylindrical hollow space of the main electrode roller 1b, as shown in FIG. 13.

Figure 20:
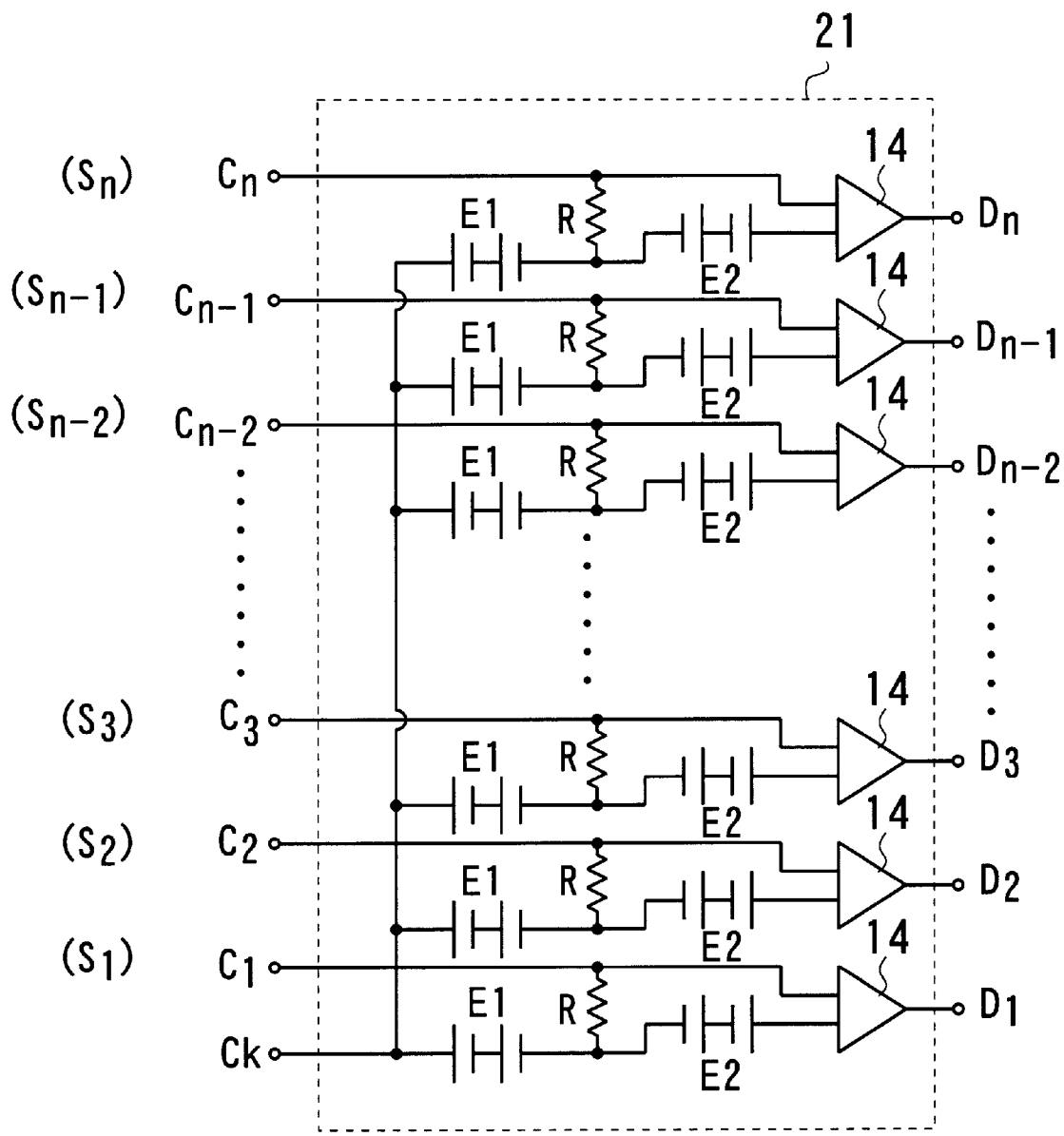
FIG. 20 is a circuit diagram of the detection circuit in the conductive-pattern recognition apparatus according to the second embodiment of FIG. 13

A detection circuit 21 has the configuration as shown in FIG. 20. Input terminals $C_1$ to $C_n$ of this detection circuit 21 are electrically connected to the sliding conductive pieces $S_1$ to $S_n$ of the sliding electrode 3, respectively. An input terminal $C_k$ is electrically connected to the current-supplying electrode 16.

In FIG. 20, the reference symbol E1 denotes constant voltage sources serving as current suppliers. The reference symbol R denotes resistors serving as current-to-voltage converters. The reference symbol E2 denotes constant voltage sources serving as constant voltage generators. The reference symbol 14 denotes comparators serving as voltage comparators. The reference symbols $D_1$ to $D_n$ denote output terminals, With the conductive-pattern recognition apparatus according to the second embodiment, the main electrode roller 1b is formed by the circular main electrodes 18 and the circular insulators 17 arranged alternately along a straight line and coupled together. The pressure-sensitive rubber layer 2 is fixed onto the outer surface of the main electrode roller 1b and is contacted with the main electrodes 18 and the insulators 17 of the main electrode roller 1b.

Therefore, when the specimen PWB 9 with the conductive pattern 10 is moved in the direction A so that the PWB 9 applies pressure to the pressure-sensitive rubber layer 2 by the driving roller 6 of the moving mechanism, a part of the pressure-sensitive rubber layer 2 is contacted with the conductive pattern 10 of the PWB 9. As a result, the part of the pressure-sensitive rubber layer 2, which is contacted with the conductive pattern 10, causes electric conduction of the at least one of the main electrodes 18 of the main electrode roller 1b.

Thus, the conductive pattern 10 of the PWB is accurately recognized in the same way as that of the first embodiment. This recognition is independent of the material and the surface state of the conductive pattern 10, because it is sufficient that the part of the pressure-sensitive rubber layer 2 realizes electric conduction of at least one of the main electrodes 18 of the main electrode roller 1b.

Also, since the pattern matching procedure is not utilized, recognition errors are prevented from occurring even if the conductive pattern 10 is complex.

Moreover, because it is sufficient that the part of the pressure-sensitive rubber layer 2, which is contacted with the conductive pattern 10 of the specimen PWB 9, realizes electric conduction of at least one of the main electrodes 18 or the main electrode roller 1b. Accordingly, not only a conductive pattern protruding from its neighborhood but also a conductive pattern depressed from or leveled with its neighborhood can be recognized.

To confirm the advantages of the present invention, the inventor performed the tests under the following condition.

A conductive-pattern recognition apparatus was fabricated according to the second embodiment.

Specifically, 501 stainless steel rings with a thickness of 0.1 mm, an inner diameter of 30 mm, and an outer diameter of 50 mm as the conductive rings 18, and 502 epoxy resin rings with a thickness of 0.1 mm, an inner diameter of 30 mm, and an outer diameter of 50 mm as the insulating rings 17 were alternately arranged along a straight line and were adhered together. At this stage, flutes were formed by the recesses 17a of the insulating rings 17.

Next, the bar-shaped current-supplying electrodes 15 made of stainless steel, each of which has a total length of 100.3 mm, a thickness of 0.05 mm, and a width of 0.05 m, were inserted into the flutes in such a way that the current-supplying electrodes 15 were not contacted with the stainless steel rings 16.

Further, the segment-shaped epoxy resin rings 19 were inserted into the recesses 18c of the stainless rings 18. As a result, the main electrode roller 1b had a total length of 100.3 mm, an inner diameter of 30 mm, an outer diameter of 50 mm, a transverse insulating gap pitch of 0.2 mm, and a longitudinal or circumferential insulating gap pitch of 0.05 mm between the supplying electrode 15 and the detection electrode 18.

The pressure-sensitive rubber layer 2 was formed by a silicone rubber with a thickness of 0.3 mm, in which conductive particles with a particle size of 20 μm were uniformly dispersed.

An obtainable minimum resolving power of the main electrode roller 1b with the pressure-sensitive rubber layer 2 was 50 μm.

Figure 21:
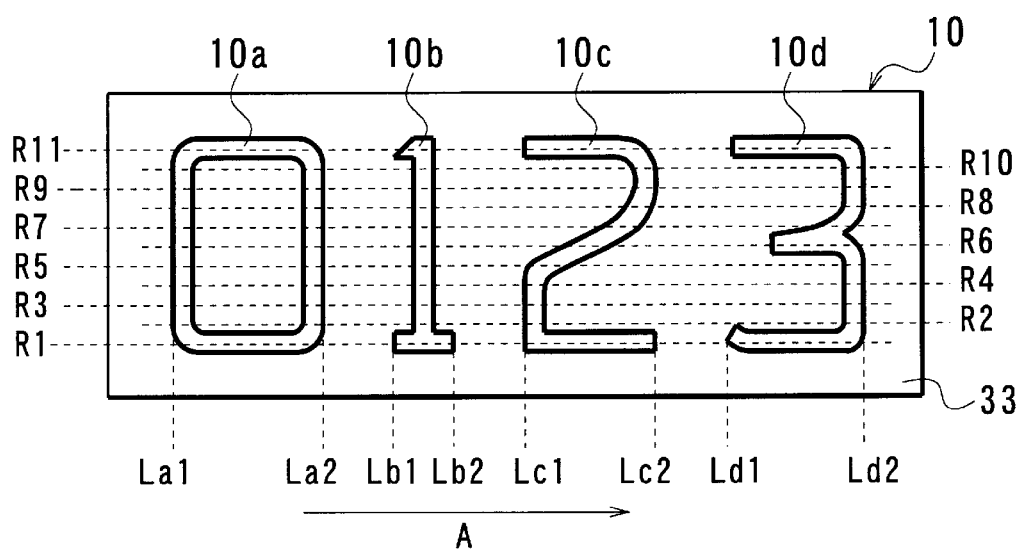
FIG. 21 is a schematic illustration of an example of a conductive pattern used in the conductive-pattern recognition apparatus according to the second embodiment of FIG. 13.

The conductive pattern 10 of the PWB 9 had a thickness of 0.4 mm and four sub-patterns 10a, 10b, 10c, and 10d, as shown in FIG. 21. The symbols $R_1$ to $R_{12}$ denotes scanning routes along which the conductive rings 18 of the main electrode roller 1b are scanned during recognition operation.

The PWB 9 was inserted into the gap between the main electrode roller 1a and the driving roller 6 and then, it was moved in the direction A at a speed of 50 mm/sec while the surface of the PWB 9 was applied with a pressure 5 kg/cm$^2$.

Figure 22:
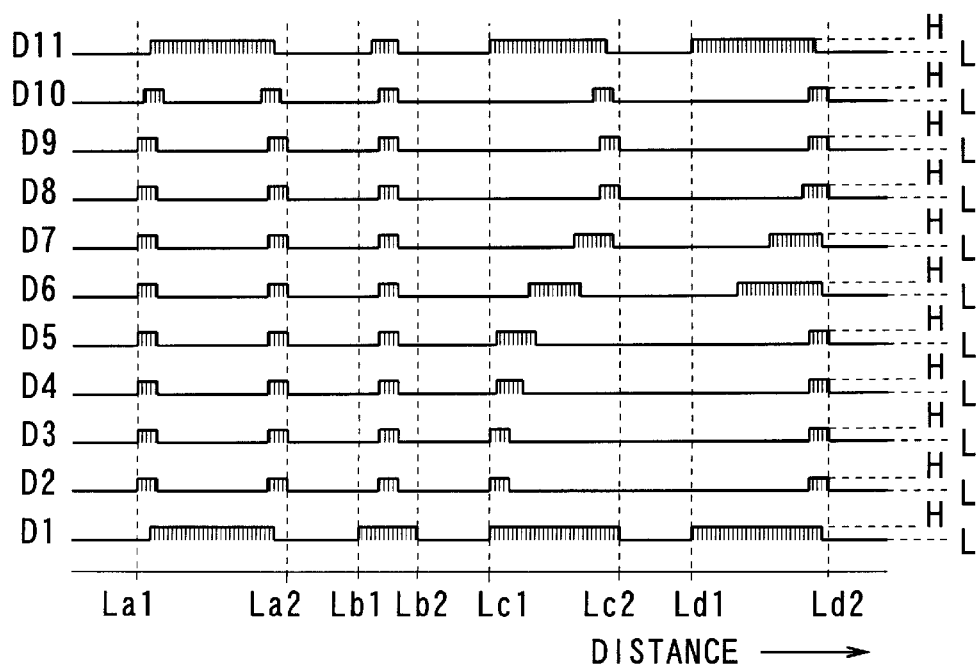
FIG. 22 is a schematic waveform diagram showing patterns of an electric current (or, output voltage) obtained by the conductive pattern shown in FIG. 21.
Figure 23:
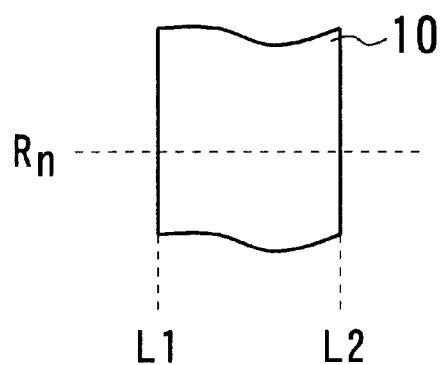
FIG. 23 is an enlarged, partial view of the conductive pattern used in the conductive-pattern recognition apparatus according to the second embodiment of FIG. 13.
Figure 24:
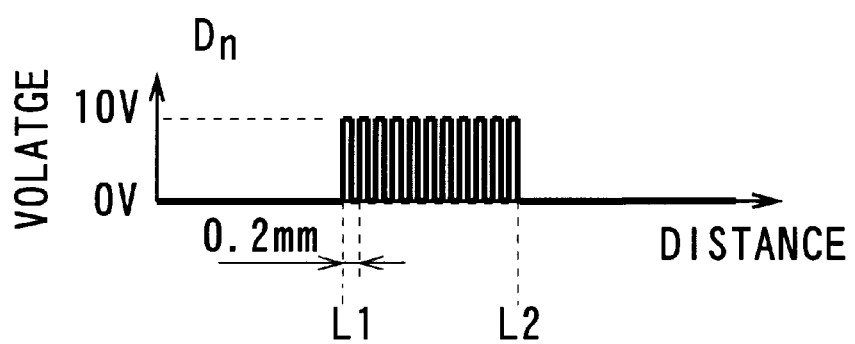
FIG. 24 is an enlarged, partial schematic waveform diagram of the output voltage obtained by the conductive pattern shown in FIG. 21.

As a result, similar to the first embodiment, the output signals generated at the output terminals $D_1$ to $D_{11}$ had the waveforms as shown in FIG. 22. It is seen from FIG. 22 that the output signals were turned from the logic low state L (or H) to the logic high state H (or L).

Using the waveforms of the output signals thus obtained, the profile or shape of the sub-patterns 10a, 10b, 10c, and 10d of the conductive pattern 10 were recognized accurately.

In the confirmation test, the minimum resolving power along the moving direction A was 0 2 mm and the minimum resolving power perpendicular to the moving direction A was 0.2 mm.

In the second embodiment, unlike the first embodiment, the waveforms are divided into series of small peaks or pulses during each logic high state H. This is because the circumferential insulating-gaps are formed between the supplying electrode 15 and the detection electrode 18.

Therefore, there is an additional advantage that the circumferential resolving power is improved compared with the first embodiment.

THIRD EMBODIMENT

Figure 25:
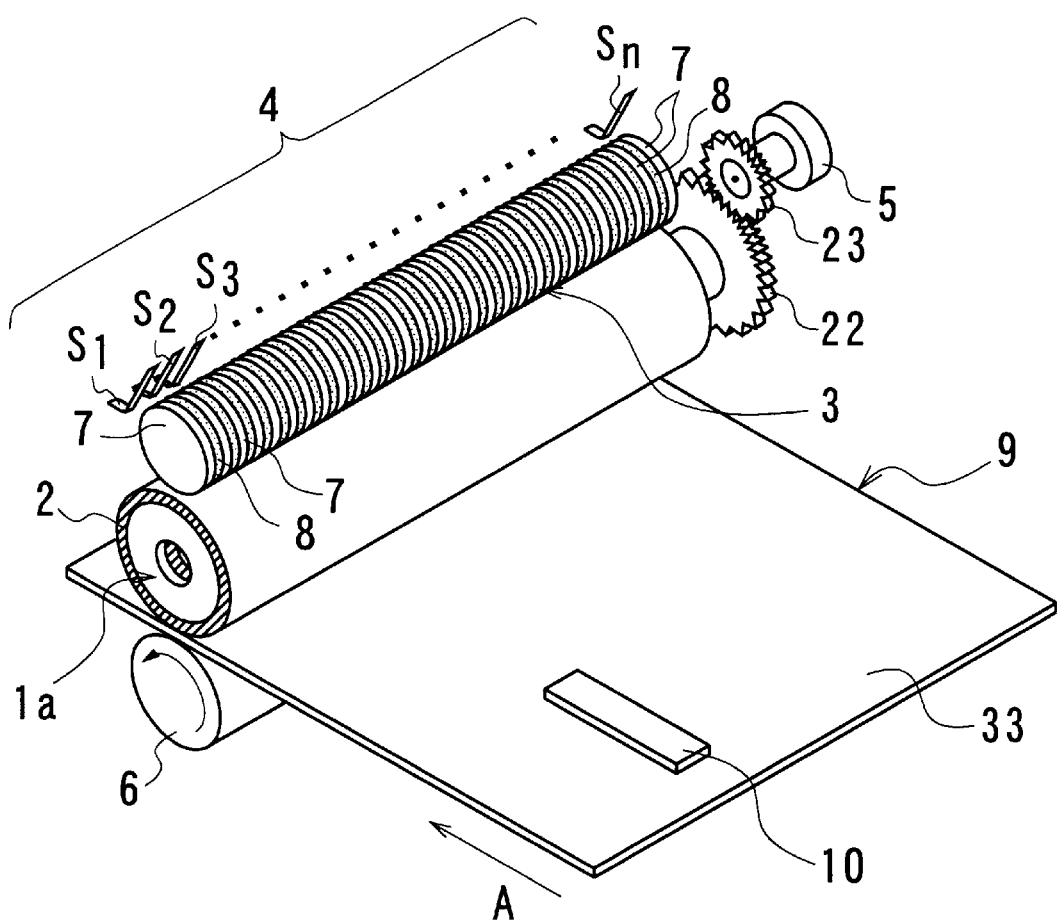
FIG. 25 is a schematic perspective illustration of a conductive-pattern recognition apparatus according to a third embodiment of the present invention.

FIG. 25 shows a conductive-pattern recognition apparatus according to a third embodiment of the present invention, which has the same configuration as that of the first embodiment except that the rotary encoder 5 is indirectly driven by the main electrode roller 1a through a gear 22 fixed to the main electrode roller 1a and a gear 23 fixed to the rotary encoder 5.

Therefore, the explanation about the same configuration as that of the first embodiment is omitted here for the sake of simplification of description by attaching the same reference numerals or characters to the same circuit elements in FIG. 25.

It is needless to say that there are the same advantages as those of the first embodiment.

FOURTH EMBODIMENT

Figure 26:
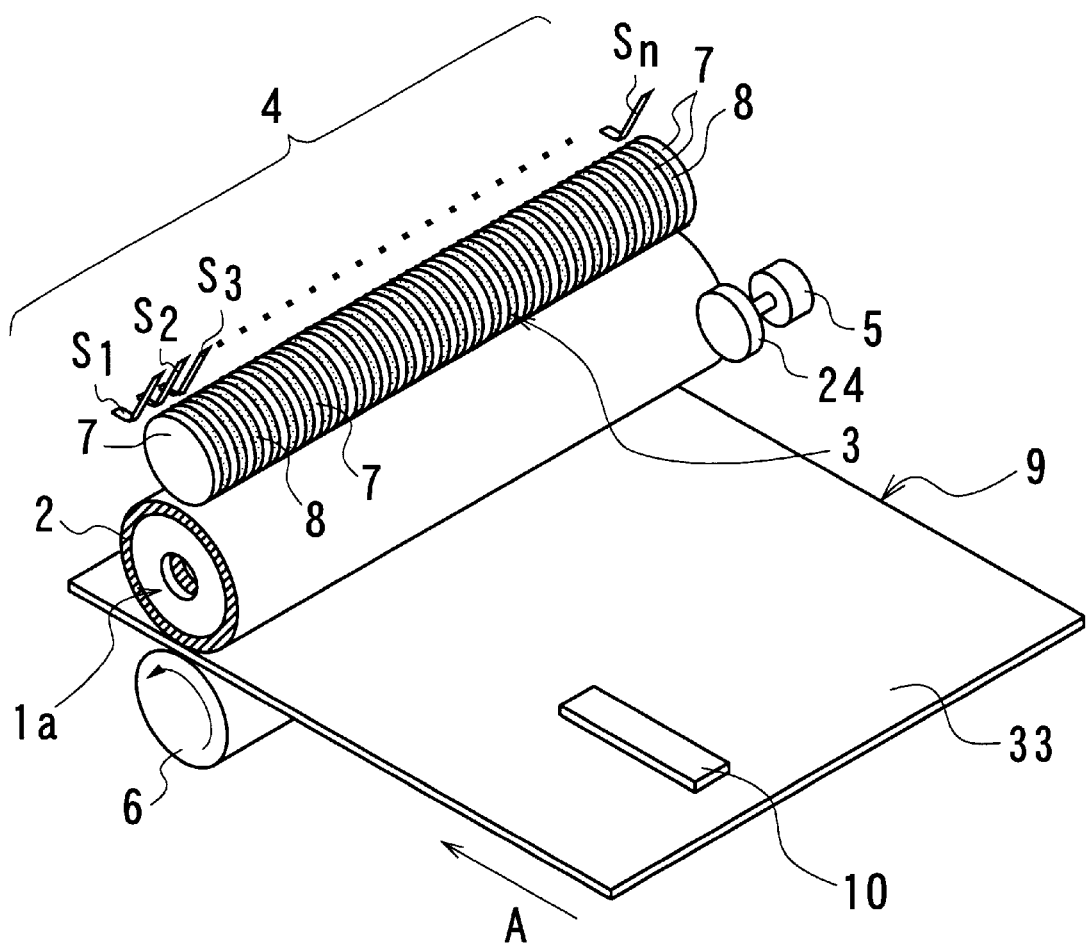
FIG. 26 is a schematic perspective illustration of a conductive-pattern recognition apparatus according to a fourth embodiment of the present invention.

FIG. 26 shows a conductive-pattern recognition apparatus according to a fourth embodiment of the present invention, which has the same configuration as that of the first embodiment except that the rotary encoder 5 is directly driven by the main electrode roller 1a through a pulley 24 contacted with the pressure-sensitive rubber layer 2 and fixed to the rotary encoder 5.

It is needless to say that there are the same advantages as those of the first embodiment.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A conductive-pattern recognition apparatus comprising:
    a main electrode roller formed by circular main electrodes and circular insulators arranged alternately along a straight line and coupled together;
    a pressure-sensitive rubber layer fixed onto an outer surface of said main electrode roller and contacted with said main electrodes and said insulators of said main electrode roller;
    a moving mechanism for moving a specimen with a conductive pattern in a direction perpendicular to a rotation axis of said main electrode roller so that said specimen applies a pressure to said pressure-sensitive rubber layer;
    a conduction detector for detecting electric conduction among at least two ones of said main electrodes of said main electrode roller through said pressure-sensitive rubber layer; and
    a rotation detector for detecting a rotation amount of said main electrode roller;
    wherein when a part of said pressure-sensitive rubber layer is contacted with said conductive pattern of said specimen, the part of said pressure-sensitive rubber layer causes electric conduction among corresponding ones of said main electrodes of said main electrode roller;
    whereby said conductive pattern of said specimen is recognized by using said conduction detector and said rotation detector.

2. The apparatus as claimed in claim 1, wherein said conduction detector is comprised of a sub electrode roller and a sliding electrode;
    wherein said sub electrode roller is formed by circular sub electrodes and circular insulators arranged alternately along a straight line and coupled together;
    said sub electrode roller being arranged to be contacted with said pressure-sensitive rubber layer under a pressure, thereby electrically connecting said sub electrodes of said sub electrode roller to said individual main electrodes of saidmain electrode roller through said pressure-sensitive rubber layer;
    and wherein said sliding electrode has sliding conductive pieces arranged to be contacted with said individual sub electrodes of said sub electrode roller.

3. The apparatus as claimed in claim 2, wherein said sub electrodes of said sub electrode roller and said sliding conductive pieces of said sliding electrode have a same pitch as said main electrodes of said main electrode roller.

4. The apparatus as claimed in claim 2, wherein said rotation detector has a rotary encoder rotated synchronously with said main electrode roller.

5. The apparatus as claimed in claim 4, wherein said rotary encoder is directly fixed to the rotation axis of said main electrode roller.

6. The apparatus as claimed in claim 4, wherein said rotary encoder is indirectly fixed to the rotation axis of said main electrode roller through at lease one additional roller.

7. The apparatus as claimed in claim 1, wherein said conduction detector has a detection circuit;
    and wherein said detection circuit has functions of converting electric currents flowing through current paths formed by respective adjacent ones of said main electrodes of said main electrode roller to output voltages, comparing the output voltages with a reference voltage, and generating a two-valued output signals according to a result of comparison.

8. A conductive-pattern recognition apparatus comprising:
    a main electrode roller formed by circular main electrodes and circular insulators arranged alternately along a straight line and coupled together;
    a pressure-sensitive rubber layer fixed onto an outer surface of said main electrode roller and contacted with said main electrodes and said insulators of said main electrode roller;
    a moving mechanism for moving a specimen with a conductive pattern in a direction perpendicular to a rotation axis of said main electrode roller so that said specimen applies a pressure to said pressure-sensitive rubber layer;
    a conduction detector for detecting electric conduction of at least one of said main electrodes of said main electrode roller through said pressure-sensitive rubber layer; and
    a rotation detector for detecting a rotation amount of said main electrode roller;
    wherein when a part of the pressure-sensitive rubber layer is contacted with said conductive pattern of said specimen, the part of said pressure-sensitive rubber layer causes electric conduction of at least one of said main electrodes of said main electrode roller, thereby recognizing said conductive pattern of said specimen by using said conduction detector and said rotation detector.

9. The apparatus as claimed in claim 8, wherein said conduction detector is comprised of a current-supplying electrode and a sliding electrode;
    and wherein said current-supplying electrode includes current-supplying conductors arranged on a periphery of said main electrode roller at a specified pitch not to be contacted with said main electrodes
    said current-supplying extending along the rotation axis of said main electrode roller;

and wherein said current-supplying electrode further includes a conductive contact piece slidingly contacted with one of said current-supplying conductors;

and wherein said sliding electrode has sliding conductive pieces arranged to be contacted with said individual main electrodes of said main electrode roller.

10. The apparatus as claimed in claim 8, wherein said sliding electrode is fixed inside said main electrode roller.

11. The apparatus as claimed in claim 8, wherein said sliding conductive pieces of said sliding electrode have a same pitch as said main electrodes of said main electrode roller.

12. The apparatus as claimed in claim 8, wherein each of said main electrodes has gear-like teeth arranged around at a pitch;

and wherein spaces between adjacent ones of said teeth of said main electrode are filled with insulators, thereby electrically insulating said main electrodes from said current-supplying conductors of said current-supplying electrode.

13. The apparatus as claimed in claim 8, wherein said rotation detector has a rotary encoder rotated synchronously with said main electrode roller.

14. The apparatus as claimed in claim 13, wherein said rotary encoder is directly fixed to the rotation axis of said main electrode roller.

15. The apparatus as claimed in claim 13, wherein said rotary encoder is indirectly fixed to the rotation axis of said main electrode roller through at lease one additional roller.

16. The apparatus as claimed in claim 13, wherein said conduction detector has a detection circuit;

wherein said detection circuit has functions of converting electric currents flowing through current paths formed by respective adjacent ones of said main electrodes of said main electrode roller to output voltages, comparing the output voltages with a reference voltage, and generating a two-valued output signals according to a result of comparison.

\* \* \* \* \*

UNITED STATES PATENT AND TRADEMARK OFFICE
CERTIFICATE OF CORRECTION

PATENT NO. : 6,188,229 B1
DATED : February 13, 2001
INVENTOR(S) : Satoshi Nakamura It is certified that error appears in the above-identified patent and that said Letters Patent is hereby corrected as shown below:

Column 8,
Line 16, delete "s" insert -- 5 --

Column 12,
Line 50, delete "seagment" insert -- segment --;
Line 54, delete "16" insert -- 18 --

Column 14,
Line 16, delete "16" insert -- 18 --

Column 16,
Line 3, delete "saidmain" insert -- said main --

Signed and Sealed this

Eighteenth Day of December, 2001

Attest:

Attesting Officer

JAMES E. ROGAN
*Director of the United States Patent and Trademark Office*